United States Patent
Miyoshi et al.

(10) Patent No.: US 7,838,117 B2
(45) Date of Patent: Nov. 23, 2010

(54) SILICONE-SEALED LED

(75) Inventors: Kei Miyoshi, Annaka (JP); Eiichi Tabei, Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 470 days.

(21) Appl. No.: 11/334,471

(22) Filed: Jan. 19, 2006

(65) Prior Publication Data

US 2006/0159937 A1    Jul. 20, 2006

(30) Foreign Application Priority Data

Jan. 20, 2005    (JP) ............................. 2005-012510

(51) Int. Cl.
- B32B 27/00 (2006.01)
- H01L 21/56 (2006.01)
- C08L 83/00 (2006.01)
- C08G 77/04 (2006.01)

(52) U.S. Cl. ..................... 428/447; 438/137; 524/862; 525/477; 528/37

(58) Field of Classification Search ................. 524/862
See application file for complete search history.

(56) References Cited

U.S. PATENT DOCUMENTS

| | | | | |
|---|---|---|---|---|
| 4,478,588 A | * | 10/1984 | Lockard | 438/26 |
| 4,880,882 A | * | 11/1989 | Morita et al. | 525/446 |
| 4,902,731 A | * | 2/1990 | Leibfried | 523/222 |
| 4,990,560 A | * | 2/1991 | Ikeno et al. | 524/731 |
| 5,063,102 A | * | 11/1991 | Lee et al. | 428/209 |
| 5,064,924 A | * | 11/1991 | Shimizu et al. | 528/15 |
| 5,086,147 A | * | 2/1992 | Ikeno et al. | 528/15 |
| 5,196,498 A | * | 3/1993 | Leibfried, Sr. | 528/15 |
| 5,548,038 A | * | 8/1996 | Enami et al. | 525/478 |
| 6,020,409 A | * | 2/2000 | Alvarez et al. | 524/267 |
| 6,204,523 B1 | * | 3/2001 | Carey et al. | 257/98 |
| 6,274,924 B1 | * | 8/2001 | Carey et al. | 257/676 |
| 6,455,878 B1 | * | 9/2002 | Bhat et al. | 257/99 |
| 6,504,301 B1 | * | 1/2003 | Lowery | 313/512 |
| 6,590,235 B2 | * | 7/2003 | Carey et al. | 257/98 |
| 6,603,148 B1 | * | 8/2003 | Sano et al. | 257/98 |
| 6,710,377 B2 | * | 3/2004 | Shimomura | 257/99 |
| 6,747,293 B2 | * | 6/2004 | Nitta et al. | 257/99 |
| 6,806,509 B2 | * | 10/2004 | Yoshino et al. | 257/103 |
| 7,153,914 B2 | * | 12/2006 | Staiger et al. | 525/478 |
| 7,405,433 B2 | * | 7/2008 | Chew | 257/99 |
| 2002/0161140 A1 | * | 10/2002 | Yoneda et al. | 526/90 |
| 2002/0190262 A1 | | 12/2002 | Nitta et al. | |
| 2002/0190637 A1 | * | 12/2002 | Matsubara et al. | 313/503 |
| 2004/0116640 A1 | * | 6/2004 | Miyoshi | 528/12 |
| 2004/0178509 A1 | | 9/2004 | Yoshino et al. | |
| 2004/0214966 A1 | * | 10/2004 | Tabei et al. | 525/478 |
| 2004/0256706 A1 | * | 12/2004 | Nakashima | 257/678 |
| 2005/0006794 A1 | | 1/2005 | Kashiwagi et al. | |
| 2005/0038221 A1 | * | 2/2005 | Tabei et al. | 528/35 |
| 2005/0130336 A1 | * | 6/2005 | Collins | 438/26 |
| 2005/0212008 A1 | * | 9/2005 | Miyoshi | 257/100 |
| 2006/0028825 A1 | * | 2/2006 | Epstein | 362/362 |
| 2006/0091788 A1 | * | 5/2006 | Yan | 313/502 |
| 2007/0032595 A1 | * | 2/2007 | Yamakawa et al. | 524/862 |
| 2007/0182323 A1 | * | 8/2007 | Ogata et al. | 313/512 |
| 2007/0287208 A1 | * | 12/2007 | Thompson et al. | 438/26 |
| 2008/0044062 A1 | * | 2/2008 | Stam et al. | 382/104 |
| 2008/0048200 A1 | * | 2/2008 | Mueller et al. | 257/98 |
| 2008/0079182 A1 | * | 4/2008 | Thompson et al. | 264/1.9 |

FOREIGN PATENT DOCUMENTS

| | | |
|---|---|---|
| DE | 30 19 239 | 11/1981 |
| EP | 1 081 761 | 3/2001 |
| JP | 7-149907 | 6/1995 |
| JP | 9-111127 | 4/1997 |
| JP | 10-142428 | 5/1998 |
| JP | 11-1619 | 1/1999 |
| JP | 2004-140220 | 5/2004 |
| JP | 2004-186168 | 7/2004 |
| WO | 2004/100279 | 11/2004 |

OTHER PUBLICATIONS

American Heritage Dictionary, definition of coating, 2 pages, 2000.*
U.S. Appl. No. 11/853,448, filed Sep. 11, 2007, Tabei.

* cited by examiner

Primary Examiner—Randy Gulakowski
Assistant Examiner—Robert Loewe
(74) Attorney, Agent, or Firm—Oblon, Spivak, McClelland, Maier & Neustadt, L.L.P.

(57) ABSTRACT

Provided is a silicone-sealed LED including: a LED chip, a cured silicone rubber layer which coats the LED chip, and a cured silicone resin layer which coats and seals the periphery of the cured silicone rubber layer. Also provided are a process for producing the silicone-sealed LED and a process for sealing a LED. In the silicone-sealed LED, a silicone rubber layer disposed between a silicone resin layer that represents the sealing body and a LED chip functions as a buffer layer, meaning cracks are not easily generated in the silicone resin layer that represents the sealing body, while full use is made of the excellent heat resistance, weather resistance, and color fastness of the silicone rubber and the silicone resin.

12 Claims, No Drawings

SILICONE-SEALED LED

CROSS REFERENCE TO RELATED APPLICATION

This application claims priority to Japanese Patent Application No. 2005-012510, filed on Jan. 20, 2005.

BACKGROUND OF THE INVENTION

1. Field of the Invention

The present invention relates to a silicone-sealed LED using a silicone resin as a sealing material, and in particular, relates to a silicone-sealed LED provided with a buffer layer comprising silicone rubber between the silicone resin seal and the LED chip. The present invention also relates to a process for producing the silicone-sealed LED and a process for sealing a LED.

2. Description of the Prior Art

Epoxy resins are generally used as the sealing materials for light emitting diode elements. However, because epoxy resins have a high modulus of elasticity, the resulting distortions which occur during temperature cycling due to the different coefficients of linear expansion for the wire, the chip, and the epoxy resin mean stress acts on the wire bonding, and as a result, cracks can occur in the sealing body comprising the resin, disconnecting the wire bonding. Consequently, as a result of the stress applied by the epoxy resin seal body to the LED chip, there is a danger of the crystal structure of the LED chip being destroyed, decreasing the luminous efficiency of the LED.

As a countermeasure to these problems, a method using a rubber-like silicone RTV as a buffer material, wherein the exterior thereof is sealed with an epoxy resin, is now established as an accepted method. However, with this method, because the epoxy resin does not adhere to the silicone resin, interfacial peeling occurs on temperature cycling, considerably decreasing the light extraction efficiency over time.

On the other hand, sealing using silicone resins instead of epoxy resins has also been proposed as a method of resolving the aforementioned problems (patent references 1 to 3). Because silicone resins exhibit superior heat resistance, weather resistance and color fastness and the like when compared with epoxy resins, in recent years, examples using silicone resins, primarily with blue and white LEDs, have become prevalent. However, although silicone resins have a low modulus of elasticity compared to epoxy resins, the mechanical properties such as the flexural strength are inferior, leaving the problem of a tendency for cracks to occur.

[Patent Reference 1] JP 11-1619A
[Patent Reference 2] US 2002/0161140 A1
[Patent Reference 3] US 2004/0116640 A1

SUMMARY OF THE INVENTION

The present invention provides a silicone-sealed LED in which cracks are not easily generated in the silicone resin layer that represents the sealing body, while full use is made of the excellent heat resistance, weather resistance, and color fastness of the silicone rubber and the silicone resin. Another object of the present invention is to provide a process for producing the silicone-sealed LED and a process for sealing a LED.

As a result of intensive investigation aimed at achieving the above object, the inventors of the present invention completed the present invention. In other words, the present invention provides a silicone-sealed LED which comprises:

a LED chip,
a cured silicone rubber layer which coats the LED chip, and
a cured silicone resin layer which coats and seals the periphery of the cured silicone rubber layer. The present invention also provides a process for producing the silicone-sealed LED and a process for sealing a LED.

The silicone rubber layer, which exists between the silicone resin layer that represents the sealing body and the LED chip, acts as a buffer layer, and consequently a silicone-sealed LED of the present invention is resistant to cracking of the silicone resin layer of the sealing body, while still exhibiting the excellent heat resistance, weather resistance and color fastness of silicone.

DETAILED DESCRIPTION OF THE PREFERRED EMBODIMENTS

As follows is a more detailed description of the present invention.

As described above, a silicone resin-sealed LED of the present invention comprises a LED chip, a cured silicone rubber layer which coats the same, and a cured silicone resin layer which coats and seals the periphery of the cured silicone rubber layer.

From the viewpoint of alleviating the stress within the produced silicone-sealed LED, the hardness of the cured silicone rubber layer, as measured by a JIS Type A hardness meter, is preferably no greater than 50, even more preferably no greater than 30, and most preferably from 0 to 20, and the hardness of the cured silicone resin layer, as measured by a Shore D hardness meter, is preferably at least 30, more preferably at least 40, and most preferably from 60 to 90.

Since it is preferable for the reflection of light at the interface between the cured silicone rubber layer and the cured silicone resin layer to be prevented, the difference between the refractive index of the liquid curable silicone rubber composition and the refractive index of the liquid curable silicone resin composition is preferably no greater than 0.05, more preferably no greater than 0.03, and most preferably no greater than 0.025.

The cured silicone rubber layer and the cured silicone resin layer can be formed, for example, by curing a liquid curable silicone rubber composition and a liquid curable silicone resin composition, respectively.

Examples of the liquid curable silicone rubber composition and the liquid curable silicone resin composition include conventional addition curing-type and condensation curing-type liquid curable compositions. However, addition curing-type compositions in which the curing reaction can proceed as rapidly as possible, where it is unnecessary to remove the alcohols and the like that represent the by-products of the curing reaction, and in which the reaction progresses quantitatively, are preferred, and of such compositions, those that are room temperature curable or heat curable are preferred.

Liquid curable silicone rubber compositions and liquid curable silicone resin compositions that are the preferred addition curing-type compositions described above typically comprise a compound which contains silicon atom-bonded alkenyl groups within the molecule, a compound which contains silicon atom-bonded hydrogen atoms within the molecule, and a hydrosilylation reaction catalyst, and are cured by a hydrosilylation reaction between the silicon atom-bonded alkenyl groups and the silicon atom-bonded hydrogen atoms. However, in terms of achieving favorable adhesion between the cured silicone rubber layer and the cured silicone resin layer, it is preferable that the quantity of silicon atom-bonded hydrogen atoms relative to each 1 mol of silicon atom-bonded alkenyl groups within the addition curing-type liquid silicone rubber composition is no greater than 0.9 mols, and even more preferably from 0.5 to 0.9 mols, and most preferably from 0.6 to 0.8 mols, and it is preferable that the quantity of silicon atom-bonded hydrogen atoms relative to each 1 mol of silicon atom-bonded alkenyl groups in the addition curing-type liquid silicone resin composition exceeds 0.9 mols, and is even more preferably from 0.91 to 4.0 mols, and most preferably from 0.95 to 2.0 mols.

As follows, the addition curing-type silicone rubber composition and the addition curing-type silicone resin composition are explained in sequence.

<Addition Curing-Type Liquid Curable Silicone Rubber Composition>

Examples of suitable addition curing-type liquid curable silicone rubber compositions include the following compositions.

A composition comprising:

(A1) an organopolysiloxane containing at least one silicon atom-bonded alkenyl group within each molecule, and represented by a formula (1) shown below:

$$R_3SiO(SiR_2O)_aSiR_3 \quad (1)$$

(wherein, each R represents, independently, an unsubstituted or substituted monovalent hydrocarbon group, and a represents a positive number at which the viscosity of the organopolysiloxane at 23° C. is no greater than 100,000 mPa·s), (B1) an organohydrogenpolysiloxane containing at least two silicon atom-bonded hydrogen atoms within each molecule, and represented by a formula (2) shown below, in a quantity that ensures that the quantity of silicon atom-bonded hydrogen atoms within the silicone rubber composition relative to each 1 mol of silicon atom-bonded alkenyl groups in the silicone rubber composition is no greater than 0.9 mols,

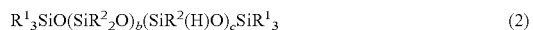

$$R^1{}_3SiO(SiR^2{}_2O)_b(SiR^2(H)O)_cSiR^1{}_3 \quad (2)$$

(wherein, each $R^1$ represents, independently, a hydrogen atom or an unsubstituted or substituted monovalent hydrocarbon group that contains no aliphatic unsaturated bonds, each $R^2$ represents, independently, an unsubstituted or substituted monovalent hydrocarbon group that contains no aliphatic unsaturated bonds, and b and c represent positive numbers at which the viscosity of the organohydrogenpolysiloxane at 23° C. is no greater than 10,000 mPa·s), and (C) an effective quantity of a hydrosilylation reaction catalyst.

(A1) Organopolysiloxane

As described above, the organopolysiloxane that represents the component (A1) is represented by the formula (1) above, although it is not preferable from the aspect of workability for it to become highly viscous, and the viscosity at 23° C. is typically no greater than 100,000 mPa·s, preferably no greater than 30,000 mPa·s, and is most preferably from 60 to 10,000 mPa·s. This organopolysiloxane must contain at least one silicon atom-bonded alkenyl group within each molecule, and preferably contains from 2 to 20, and most preferably from 2 to 10 of such alkenyl groups. Within the organopolysiloxane molecule, these silicon atom-bonded alkenyl groups may be found at the molecular chain terminals, at non-terminal molecular chain positions, or at both of these positions.

In the formula (1) above, a represents a positive number that ensures that the viscosity of the organopolysiloxane satisfies the above range.

The number of carbon atoms within the unsubstituted or substituted monovalent hydrocarbon group represented by R is typically from 1 to 12, and is preferably from 1 to 8. Examples of this monovalent hydrocarbon group include alkyl groups such as a methyl group, ethyl group, n-propyl group, isopropyl group, butyl group, isobutyl group, tert-butyl group, hexyl group, cyclohexyl group, octyl group, norbornyl group, or isonorbornyl group; alkenyl groups such as a vinyl group, allyl group, propenyl group, or butenyl group; aryl groups such as a phenyl group or tolyl group; aralkyl groups such as a benzyl group or phenylethyl group; and substituted hydrocarbon groups such as a trifluoropropyl group in which a portion of, or all of, the hydrogen atoms of these groups have been substituted with a halogen atom such as fluorine or chlorine.

The structure of the organopolysiloxane of this component is not particularly restricted from the aspect of stress relaxation, and suitable examples include a straight-chain, branched-chain, three-dimensional network, or cyclic structure, although it is desirable that the structure does not greatly differ from the structure of the organopolysiloxane in the cured silicone resin layer, which coats and seals the periphery of the cured silicone rubber layer generated by this component. The reason for this requirement is to prevent the reflection of light at the interface between the cured silicone rubber layer and the cured silicone resin layer within the silicone-sealed LED.

Examples of the organopolysiloxane of this component include $ViMe_2SiO(SiMe_2O)_gSiMe_2Vi$, $ViMe_2SiO(SiMe_2O)_g(SiMePhO)_hSiMe_2Vi$, $ViMe_2SiO(SiMe_2O)_g(SiPh_2O)_hSiMe_2Vi$, $ViMe_2SiO(SiMe(C_3H_4F_3)O)_gSiMe_2Vi$, $Me_3SiO(SiViMeO)_g(SiMe_2O)_hSiMe_3$, $ViMe_2SiO(SiViMeO)_g(SiMe_2O)_hSiMe_2Vi$, $Vi_3SiO(SiMe_2O)_gSiMeVi_3$, and $ViMe_2SiO(SiMe_2O)_gSiMe_3$.

(wherein, Vi represents a vinyl group, Me represents a methyl group, Ph represents a phenyl group, g and h each independently represent positive integers, and g+h falls within a range that satisfies the viscosity defined above. These definitions also apply below.)

The organopolysiloxane of this component may use either a single compound, or a combination of two or more different compounds.

(B1) Organohydrogenpolysiloxane

The organohydrogenpolysiloxane that represents the component (B1) acts as a cross-linking agent for curing the composition via a cross-linking reaction with the component (A1), and is represented by the formula (2) shown above.

The viscosity of this organohydrogenpolysiloxane at 23° C. is no greater than 10,000 mPa·s, and from the aspects of workability and ease of production of the silicone rubber composition, is preferably no greater than 5,000 mPa·s, and is most preferably within a range from 1 to 3,000 mPa·s. This organohydrogenpolysiloxane must contain at least two silicon atom-bonded hydrogen atoms within each molecule, and preferably contains from 2 to 100, and most preferably from 3 to 50 of such hydrogen atoms. In the organohydrogenpolysiloxane molecule, these silicon atom-bonded hydrogen atoms may be found at the molecular chain terminals or at non-terminal molecular chain positions, or at both of these positions.

There are no particular restrictions on the structure of the organohydrogenpolysiloxane of this composition, and suitable examples include a straight-chain, branched-chain, three-dimensional network, or cyclic structure.

This composition is preferably able to be mixed uniformly with the component (A1), and furthermore, in order to ensure that the resulting silicone resin-sealed LED exhibits excellent optical characteristics, a composition which is as close as possible to colorless or transparent is preferable.

In the formula (2) above, b and c represent positive numbers that ensure that the viscosity of the organopolysiloxane satisfies the above range.

The number of carbon atoms within the unsubstituted or substituted monovalent hydrocarbon group represented by $R^1$, which contains no aliphatic unsaturated bonds, is typically from 1 to 10, and is preferably from 1 to 8. Examples of this monovalent hydrocarbon group include alkyl groups such as a methyl group, ethyl group, n-propyl group, isopropyl group, butyl group, isobutyl group, tert-butyl group, hexyl group, cyclohexyl group, or octyl group; aryl groups such as a phenyl group or tolyl group; aralkyl groups such as a benzyl group; and halogen-substituted monovalent hydrocarbon groups in which either a portion of, or all of, the hydrogen atoms within these groups have been substituted with a halogen atom such as fluorine or chlorine, including a chloromethyl group, bromoethyl group, or trifluoropropyl group. $R^1$ is preferably a hydrogen atom, methyl group, phenyl group or trifluoropropyl group.

The number of carbon atoms within the unsubstituted or substituted monovalent hydrocarbon group represented by $R^2$, which contains no aliphatic unsaturated bonds, is typically from 1 to 10, and is from preferably 1 to 6. Examples of this monovalent hydrocarbon group include the unsubstituted and substituted monovalent hydrocarbon groups listed above for $R^1$.

Examples of the organohydrogenpolysiloxane of this component include $Me_3SiO(SiMe(H)O)_iSiMe_3$, $Me_3SiO(SiMe(H)O)_i(SiMe_2O)_j SiMe_3$, $Me_3SiO(SiMe(H)O)_i(SiPh_2O)_k (SiMe_2O)_jSiMe_3$, $(H)Me_2SiO(SiMe_2O)_jSiMe_2(H)$, $(H)Me_2SiO(SiMe(H)O)_i(SiMe_2O)_j SiMe_2(H)$, (wherein, i, j and k each independently represent positive integers, and i, i+j, and i+j+k each fall within a range that satisfies the viscosity defined above), cyclic compounds such as tetramethyltetrahydrocyclosiloxane, compounds in which a portion of the hydrogen atoms within these compounds have been reacted with vinyltrimethoxysilane or an epoxy compound that contains an unsaturated bond, and $PhSi(OSiMe_2H)_3$.

As described below, this silicone rubber composition may also include components containing silicon atom-bonded alkenyl groups other than the component (A1), and/or components containing silicon atom-bonded hydrogen atoms other than the component (B1). Accordingly, the quantity of silicon atom-bonded hydrogen atoms in this silicone rubber composition relative to each 1 mol of silicon atom-bonded alkenyl groups in this silicone rubber composition is typically within a range from 0.5 to 5 mols, and preferably within a range from 0.6 to 3 mols, and the proportion of the total number of silicon atom-bonded hydrogen atoms in this silicone rubber composition accounted for by the silicon atom-bonded hydrogen atoms within the component (B1) is typically within a range from 1 to 100 mol %, and is preferably from 2 to 100 mol %. Moreover, the proportion of the total number of silicon atom-bonded alkenyl groups in this silicone rubber composition accounted for by the silicon atom-bonded alkenyl groups in the component (A1) is typically within a range from 10 to 100 mol %, and is preferably from 30 to 100 mol %. With such values, a cured rubber with excellent physical properties, such as mechanical strength, can be obtained.

Furthermore, as mentioned above, from the viewpoint of improving the adhesion between the cured silicone rubber layer and the cured silicone resin layer, it is preferable that the quantity of silicon atom-bonded hydrogen atoms within this silicone rubber composition relative to each 1 mol of silicon atom-bonded alkenyl groups within the silicone rubber composition is no greater than 0.9 mols, and is even more preferably within a range from 0.5 to 0.9 mols, and most preferably from 0.6 to 0.8 mols.

The organohydrogenpolysiloxane of this component may use either a single material, or a combination of two or more different materials.

(C) Hydrosilylation Reaction Catalyst

The hydrosilylation reaction catalyst that represents the component (C) promotes the hydrosilylation reaction between the silicon atom-bonded alkenyl groups within the component (A1) and the silicon atom-bonded hydrogen atoms within the component (B1). There are no particular restrictions on this hydrosilylation reaction catalyst, and all conventionally known substances can be used, including platinum-based catalysts such as platinum black, platinic chloride, chloroplatinic acid, reaction products of chloroplatinic acid and monovalent alcohols, complexes of chloroplatinic acid and olefins, and platinum bis(acetoacetate); as well as other platinum group metal-based catalysts such as palladium-based catalysts and rhodium-based catalysts, although because they are used in the production of sealed LEDs within the electronics field, catalysts that have been modified using divinyltetramethyldisiloxane or divinyldiphenyldimethyldisiloxane or the like, and contain no chlorine component, are preferred. These hydrosilylation reaction catalysts may use either a single material, or a combination of two or more different materials.

The blend quantity of the component (C) need only be an effective catalytic quantity, and in this silicone rubber composition, from an economic viewpoint, a typical quantity, calculated as the mass of the platinum-group metal element, is normally no greater than 200 ppm, preferably within a range from 0.1 to 50 ppm, and most preferably from 0.5 to 20 ppm.

Other Components

The silicone rubber composition may also contain straight-chain diorganopolysiloxanes or network-type organopolysiloxanes that contain silicon atom-bonded alkenyl groups or silicon atom-bonded hydrogen atoms other than the aforementioned components (A1) and (B1), and/or unreactive straight-chain or cyclic diorganopolysiloxanes, or silphenylene-based compounds or the like, provided the addition of these other components does not impair the effects of the present invention.

In addition, other components such as an adhesion improver for improving adhesion, a reaction retarder for ensuring satisfactory pot life, or an inorganic filler for improving the strength of the cured product may also be added. Examples of suitable adhesion improvers include siloxanes modified by an epoxy group or alkoxysilyl group or the like. Examples of suitable reaction retarders include tetramethyltetravinylcyclosiloxane, acetylene alcohols such as 1-ethylnylcyclohexanol and 3,5-dimethyl-1-hexyn-3-ol, and triallyl isocyanurate, as well as modified products thereof. Examples of suitable inorganic fillers include fumed silica, crushed silica and silicone resins. Furthermore, dyes, pigments and flame retardants can also be added. These components may use either a single material, or a combination of two or more different materials.

The liquid curable silicone rubber composition can be prepared by stirring and mixing together the aforementioned component (A1), the component (B1) and the component (C), together with any other components, using normal methods.

By curing the silicone rubber composition, preferably at 15 to 150° C., a cured silicone rubber layer that coats the LED can be formed.

<Addition Curing-Type Liquid Curable Silicone Resin Composition>

For the addition curing-type liquid curable silicone resin composition, any silicone resin with a three-dimensional network structure which exhibits a hardness following curing that is sufficient for practical use at the time of assembly of the LED (for example, a value of at least 30 on a Shore D hardness meter), can be used. Specific examples of these resins include those described below.

RESIN COMPOSITION EXAMPLE 1

A resin composition comprising:
(A2) 100 parts by mass of an organopolysiloxane with a viscosity of at least 10 mPa·s at 23° C., represented by the average composition formula (3) shown below:

$$R^3_d SiO_{(4-d)/2} \qquad (3)$$

(wherein, each $R^3$ represents, independently, an unsubstituted or substituted monovalent hydrocarbon group or alkoxy group, or a hydroxyl group, provided 5 to 50 mol % of all $R^3$ groups represent alkenyl groups, and d represents a number that satisfies $1 \leq d < 2$),
(B2) 2 to 100 parts by mass of an organohydrogenpolysiloxane with a viscosity of no greater than 1,000 mPa·s at 23° C., and containing at least two silicon atom-bonded hydrogen atoms within each molecule, represented by the average composition formula (4) below:

$$R^4_e H_f SiO_{(4-e-f)/2} \qquad (4)$$

(wherein, each $R^4$ represents, independently, an unsubstituted or substituted monovalent hydrocarbon group that contains no aliphatic unsaturated bonds, e represents a number from 0.7 to 2.1, f represents a number from 0.01 to 1.0, and e+f satisfies a range from 0.8 to 3), and
(C) an effective quantity of a hydrosilylation reaction catalyst.

(A2) Organopolysiloxane

The organopolysiloxane that represents the component (A2) represents the principal component of the silicone resin layer, and as described above, is represented by the formula (3) shown above, although from the viewpoints of workability and the mechanical properties, the viscosity at 23° C. is at least 10 mPa·s, and is preferably within a range from 600 mPa·s through to a solid. This organopolysiloxane contains alkenyl groups within the molecule, and preferably contains from 2 to 6 alkenyl groups within each molecule. Within the organopolysiloxane molecule, these silicon atom-bonded alkenyl groups may be found at the molecular chain terminals, at non-terminal molecular chain positions, or at both of these positions.

There are no particular restrictions on the structure of the organohydrogenpolysiloxane of this component, and suitable structures include, for example, straight-chain, branched-chain, three-dimensional network, or cyclic structures, although a three-dimensional network structure is preferred.

In the formula (3) above, d preferably represents a positive number from 1 to 1.8.

The number of carbon atoms within an unsubstituted or substituted monovalent hydrocarbon group represented by $R^3$ is typically from 1 to 12, and preferably from 1 to 9. Examples of this monovalent hydrocarbon group include the unsubstituted and substituted monovalent hydrocarbon groups listed above as examples of the group R. Furthermore, the number of carbon atoms within an unsubstituted or substituted alkoxy group represented by $R^3$ is typically from 1 to 4, and preferably from 1 to 2. Examples of this alkoxy group include a methoxy group, ethoxy group, propoxy group, isopropoxy group, butoxy group, isobutoxy group, or tert-butoxy group. For the $R^3$ group, a methyl group, phenyl group, vinyl group, norbornyl group, or isonorbornyl group is preferred.

In the formula (3) above, from the viewpoints of availability and balancing the physical properties such as the mechanical strength, it is preferable that all of the $R^3$ groups other than the alkenyl groups represented by $R^3$ are methyl groups and/or phenyl groups.

Examples of the organopolysiloxane of this component include:
$[(C_6H_5)SiO_{3/2}]_a[(CH_3)(CH_2\!=\!\!CH)SiO_{2/2}]_b[(CH_3)_2SiO_{2/2}]_c$
$[(C_6H_5)SiO_{3/2}]_a[(CH_3)_2(CH_2\!=\!\!CH)SiO_{1/2}]_b[(CH_3)_2 SiO_{2/2}]_c$
$[(C_6H_5)SiO_{3/2}]_a[(CH_3)(CH_2\!=\!\!CH)SiO_{2/2}]_b[(C_6H_5)_2 SiO_{2/2}]_c$
(wherein, a, b and c each independently represent positive numbers less than 1, and a+b+c=1).

The organopolysiloxane of this component may use either a single material, or a combination of two or more different materials.

(B2) Organohydrogenpolysiloxane

The organohydrogenpolysiloxane that represents the component (B2) acts as a curing agent for curing the silicone resin composition by forming a cross-linked structures with the component (A2), and also acts as a reaction retarder that liquidizes the component (A2) by dissolution, and is represented by the formula (4) shown above. The viscosity of this organohydrogenpolysiloxane at 23° C. is no greater than 1,000 mPa·s, and from the viewpoint of ensuring favorable workability, is preferably no greater than 500 mPa·s, and is most preferably within a range from 1 to 300 mPa·s. This organohydrogenpolysiloxane must contain at least two silicon atom-bonded hydrogen atoms within each molecule, and preferably contains from 2 to 100, and most preferably from 3 to 50 of these hydrogen atoms. Within the organohydrogenpolysiloxane molecule, these silicon atom-bonded hydrogen atoms may be found at the molecular chain terminals, at non-terminal molecular chain positions, or at both of these positions.

There are no particular restrictions on the structure of the organohydrogenpolysiloxane of this component, and suitable structures include, for example, straight-chain, branched-chain, three-dimensional network, or cyclic structures, although straight-chain and cyclic structures are preferred.

This component has the effect of improving adhesion by penetrating the aforementioned cured silicone rubber layer during curing of the silicone resin composition, and reacting with the alkenyl groups, such as vinyl groups, within the cured silicone rubber layer. For this reason, it is preferable to use a low molecular weight compound that easily penetrates the cured silicone rubber layer as a portion of this component (B2).

In the formula (4) above, e preferably represents a number from 1.0 to 2.1, f preferably represents a number from 0.1 to 1.0, and e+f preferably satisfies a range from 1.1 to 2.6.

Furthermore, the unsubstituted or substituted monovalent hydrocarbon group that contains no aliphatic unsaturated bonds represented by $R^4$ typically contains from 1 to 12, and preferably from 1 to 9, carbon atoms. Examples of this monovalent hydrocarbon group include the monovalent hydrocarbon groups listed above for the group $R^1$.

Examples of the organohydrogenpolysiloxane of this component include the same substances presented as specific examples of the organohydrogenpolysiloxane of the component (B1) in the above.

The organohydrogenpolysiloxane of this component may use either a single material, or a combination of two or more different materials.

As described below, this silicone resin composition may also include components containing silicon atom-bonded alkenyl groups other than the component (A2), and/or components containing silicon atom-bonded hydrogen atoms other than the component (B2). Accordingly, the quantity of silicon atom-bonded hydrogen atoms in this silicone resin composition relative to each 1 mol of silicon atom-bonded alkenyl groups in this silicone resin composition is typically within a range from 0.5 to 5 mols, and preferably within a range from 0.6 to 3 mols. Moreover, the proportion of the total number of silicon atom-bonded alkenyl groups in this silicone resin composition accounted for by the silicon atom-bonded alkenyl groups within the component (A2) is typically within a range from 70 to 100 mol %, and is preferably from 80 to 100 mol %. With such values, a cured resin layer with excellent physical properties, such as mechanical strength, can be obtained.

Furthermore, as was mentioned above, from the viewpoint of improving the adhesion between the cured silicone rubber layer and the cured silicone resin layer, it is preferable that the quantity of silicon atom-bonded hydrogen atoms within this silicone resin composition relative to each 1 mol of silicon atom-bonded alkenyl groups within the silicone resin composition exceeds 0.9 mols, and is even more preferably greater than 0.9 mols but no more than 3 mols, and most preferably greater than 0.9 mols but no more than 2 mols.

(C) Hydrosilylation Reaction Catalyst

The hydrosilylation reaction catalyst that represents the component (C) is as described above in relation to the addition curing-type liquid silicone rubber composition above, and the same materials can be used.

The blend quantity of the component (C) need only be an effective catalytic quantity, and in this composition, from an economic viewpoint, a typical quantity, calculated as the mass of the platinum-group metal element, is normally within a range from 0.1 to 200 ppm, and preferably from 2 to 50 ppm, and most preferably from 3 to 20 ppm.

Other Components

The silicone resin composition may also contain, in addition to the components (A2), (B2) and (C), adhesion improvers, reaction retarders, and inorganic fillers and the like, provided the addition of these other components does not impair the effects of the present invention. Specific examples of these other components include the materials listed above in the paragraph concerning other components of the silicone rubber composition.

Production Method

A liquid curable silicone resin composition 1 can be prepared by stirring and mixing together the aforementioned component (A2), the component (B2) and the component (C), together with any other components, using normal methods. By curing the silicone resin composition, preferably at 80 to 150° C., a cured silicone resin layer that can be used in a silicone-sealed LED of the present invention can be produced.

RESIN COMPOSITION EXAMPLE 2

A resin composition comprising:

(A3) a siloxane-based compound that contains at least two silicon atom-bonded alkenyl groups within each molecule, (B3) a siloxane-polycyclic hydrocarbon-based compound, which is an addition reaction product of (a) a siloxane-based compound containing at least three silicon atom-bonded hydrogen atoms within each molecule, and (b) a polycyclic hydrocarbon containing two addition reactive carbon-carbon double bonds within each molecule, and contains at least two silicon atom-bonded hydrogen atoms within each molecule, and (C) a hydrosilylation reaction catalyst.

(A3) Siloxane-Based Compound

The siloxane-based compound that represents the component (A3) is a siloxane-based compound that contains at least two silicon atom-bonded alkenyl groups within each molecule, and undergoes an addition to the component (B3) described below via a hydrosilylation reaction to yield the cured product. Within the siloxane-based compound molecule, these silicon atom-bonded alkenyl groups may be found at the molecular chain terminals, at non-terminal molecular chain positions, or at both of these positions.

Examples of this component (A3) include the cyclic siloxane compounds represented by the general formula (5) shown below:

(5)

(wherein, each $R^5$ represents, independently, an unsubstituted or substituted monovalent hydrocarbon group of 1 to 12, and preferably 1 to 6, carbon atoms, although of the plurality of $R^5$ groups, at least two are alkenyl groups, and p represents an integer from 3 to 20, preferably from 3 to 8), and linear siloxane-based compounds represented by the general formula (6) shown below:

$$R^6{}_3SiO\text{---}(R^5{}_2SiO)_q\text{---}SiR^6{}_3 \qquad (6)$$

(wherein, each $R^5$ and $R^6$ represents, independently, an unsubstituted or substituted monovalent hydrocarbon group of 1 to 12, and preferably 1 to 6, carbon atoms, although of the plurality of $R^5$ and/or $R^6$ groups, at least two are alkenyl groups, and in a case where all of the $R^5$ groups are not alkenyl groups, q represents either 0, or an integer from 1 to 100, and preferably from 1 to 20, and in a case where all of the $R^6$ groups are not alkenyl groups, or only one is an alkenyl group, q represents an integer from 2 to 100, and preferably from 2 to 20).

Examples of $R^5$ and $R^6$ include alkyl groups such as a methyl group, ethyl group, propyl group, isopropyl group, butyl group, tert-butyl group, pentyl group, hexyl group, heptyl group, octyl group, nonyl group, decyl group, or octadecyl group; cycloalkyl groups such as a cyclopentyl group or cyclohexyl group; aryl groups such as a phenyl group, tolyl group, xylyl group, or naphthyl group; aralkyl groups such as a benzyl group, phenethyl group, or 3-phenylpropyl group; halogenated alkyl groups such as a 3,3,3-trifluoropropyl group or 3-chloropropyl group; and alkenyl groups such as a vinyl group, allyl group, butenyl group, pentenyl group or hexenyl group.

Amongst these, from the viewpoint of industrial availability, in those cases where $R^5$ and $R^6$ are alkenyl groups, vinyl groups are preferred, whereas in those cases where they are not alkenyl groups, methyl groups are preferred.

Specific examples of suitable compounds for the component (A3) are shown below, although the component (A3) is in no way restricted by these examples.

(ViMeSiO)$_3$
(ViMeSiO)$_4$
(ViMeSiO)$_3$(Me$_2$SiO)
(ViMeSiO)$_4$(Me$_2$SiO)
Me$_3$SiO—(ViMeSiO)$_5$(Me$_2$SiO)$_5$—SiMe$_3$
ViMe$_2$SiO—(Me$_2$SiO)$_5$—SiMe$_2$Vi
ViMe$_2$SiO—(Ph$_2$SiO)$_5$(Me$_2$SiO)$_5$—SiMe$_2$Vi
ViMe$_2$SiO—(ViMeSiO)$_5$(Me$_2$SiO)$_5$—SiMe$_2$Vi

The component (A3) may use either a single material, or a combination of two or more different materials.

(B3) Siloxane-Polycyclic Hydrocarbon-Based Compound

The siloxane-polycyclic hydrocarbon-based compound of the component (B3) contains at least two silicon atom-bonded hydrogen atoms within each molecule, and is a hydrocarbon-based compound that contains both a siloxane structure and a polycyclic structure. This siloxane-polycyclic hydrocarbon-based compound is an addition reaction product of (a) a siloxane-based compound containing at least three silicon atom-bonded hydrogen atoms within each molecule, and (b) a polycyclic hydrocarbon containing two addition reactive carbon-carbon double bonds within each molecule.

The siloxane-polycyclic hydrocarbon-based compound of this component preferably contains from 2 to 100, and even more preferably from 2 to 50, silicon atom-bonded hydrogen atoms within each molecule. Within the siloxane-polycyclic hydrocarbon-based compound molecule, these silicon atom-bonded hydrogen atoms may be found at the molecular chain terminals, at non-terminal molecular chain positions, or at both of these positions. Furthermore, the siloxane-based compound (a) preferably contains from 3 to 10, and even more preferably from 3 to 5, silicon atom-bonded hydrogen atoms within each molecule.

Component (a)

Examples of the siloxane-based compound containing at least three silicon atom-bonded hydrogen atoms within each molecule (a), which is a reaction raw material for the component (B3), include cyclic siloxane-based compounds represented by the general formula (7):

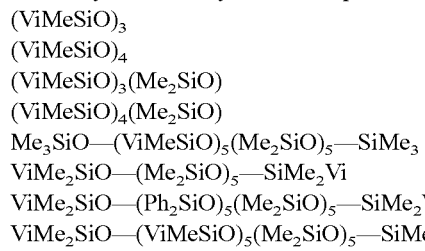

(wherein, each $R^7$, $R^8$ and $R^9$ represents, independently, a hydrogen atom or an unsubstituted or substituted monovalent hydrocarbon group of 1 to 12, and preferably 1 to 6, carbon atoms, r represents an integer from 3 to 10, and preferably from 3 to 8, s represents an integer from 0 to 7, and preferably from 0 to 2, and r+s is an integer from 3 to 10, and preferably from 3 to 6), and linear siloxane-based compounds represented by the general formula (8) shown below:

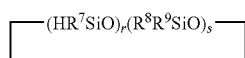 (8)

(wherein, each $R^7$, $R^8$ and $R^9$ is as defined above for the general formula (7), t represents an integer from 3 to 50, and preferably from 3 to 30, u represents an integer from 0 to 47, and preferably from 0 to 20, and t+u is an integer from 3 to 50, and preferably 3 to 30).

In those cases where $R^7$, $R^8$ and $R^9$ represent monovalent hydrocarbon groups, specific examples of the groups include alkyl groups such as a methyl group, ethyl group, propyl group, isopropyl group, butyl group, tert-butyl group, pentyl group, isopentyl group, hexyl group, or sec-hexyl group; cycloalkyl groups such as a cyclopentyl group or cyclohexyl group; aryl groups such as a phenyl group, or o-, m-, or p-tolyl group; aralkyl groups such as a benzyl group or 2-phenylethyl group; alkenyl groups such as a vinyl group, allyl group, 1-butenyl group, or 1-hexenyl group; alkenylaryl groups such as a p-vinyl-phenyl group; and groups in which one or more of the hydrogen atoms within these groups have been substituted with a halogen atom, cyano group, or epoxy group, including halogenated alkyl groups such as a chloromethyl group, 3-chloropropyl group, or 3,3,3-trifluoropropyl group, as well as a 2-cyanoethyl group or a 3-glycidoxypropyl group. Amongst these, groups other than alkenyl groups and alkenylaryl groups are preferred, and cases in which all the groups are methyl groups are particularly desirable.

Specific examples of suitable compounds for the component (a) are shown below, although the component (a) is in no way restricted by these examples.

(HMeSiO)$_3$
(HMeSiO)$_4$
(HMeSiO)$_3$(Me$_2$SiO)
(HMeSiO)$_4$(Me$_2$SiO)
Me$_3$SiO—(HMeSiO)$_5$(Me$_2$SiO)$_5$—SiMe$_3$
Me$_3$SiO—(HMeSiO)$_{20}$(Me$_2$SiO)$_{20}$—SiMe$_3$

The component (a) may use either a single material, or a combination of two or more different materials.

Component (b)

In the polycyclic hydrocarbon containing two addition reactive carbon-carbon double bonds within each molecule (b), which is the other reaction raw material for the component (B3), the term "addition reactive" refers to an ability to accept addition of silicon atom-bonded hydrogen atoms (known as a hydrosilylation reaction).

Examples of the polycyclic hydrocarbon of the component (b) include, for example, (i) compounds in which addition reactive carbon-carbon double bonds have been formed between sets of adjacent carbon atoms amongst the carbon atoms that form the polycyclic skeleton of the polycyclic hydrocarbon, (ii) compounds in which hydrogen atoms bonded to the carbon atoms that form the polycyclic skeleton of the polycyclic hydrocarbon have been substituted with addition reactive carbon-carbon double bond-containing groups, (iii) compounds in which an addition reactive carbon-carbon double bond has been formed between two adjacent carbon atoms amongst the carbon atoms that form the polycyclic skeleton of the polycyclic hydrocarbon, and a hydrogen atom bonded to a carbon atom that forms the polycyclic skeleton of the polycyclic hydrocarbon has been substituted with an addition reactive carbon-carbon double bond-containing group.

There are no particular restrictions on the siloxane-polycyclic hydrocarbon-based compound, provided the above requirements are fulfilled, although compounds represented by a general formula (9) shown below:

 (9)

(wherein, X represents a bivalent residue of the above siloxane-based compound (a), Y represents a bivalent residue of the above polycyclic hydrocarbon (b), Y' represents a monovalent residue of the above polycyclic hydrocarbon (b), H represents a hydrogen atom, and v represents an integer from 0 to 1,000, and preferably from 0 to 100), compounds represented by a general formula (10) shown below:

(wherein, X, Y and H are as defined above, and w represents an integer from 1 to 1,000, and preferably from 1 to 100), and compounds represented by a general formula (11) shown below:

(wherein, X, Y and Y' are as defined above, and z represents an integer from 1 to 1,000, and preferably from 1 to 100), are preferred.

Examples of the group X (in other words, the bivalent residue of the above siloxane-based compound (a)) in the above formulas (9) to (11) include, for example, cyclic or chain-like bivalent groups represented by the general formula shown below:

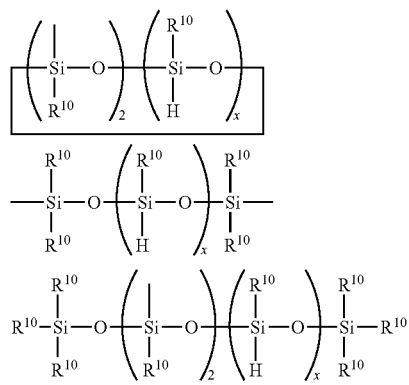

(wherein, each $R^{10}$ represents, independently, a monovalent hydrocarbon group or alkoxy group of 1 to 12, and preferably 1 to 6, carbon atoms, and x represents an integer of at least 1, and preferably 2 or greater, and most preferably 2).

Examples of the monovalent hydrocarbon group represented by $R^{10}$ include alkyl groups such as a methyl group, ethyl group, propyl group, isopropyl group, butyl group, tert-butyl group, or n-hexyl group; and aryl groups such as a phenyl group. Furthermore, examples of the alkoxy group represented by $R^{10}$ include a methoxy group, ethoxy group or propoxy group.

Specific examples of X include, for example, the cyclic siloxane residues shown below:

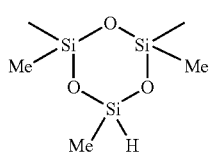
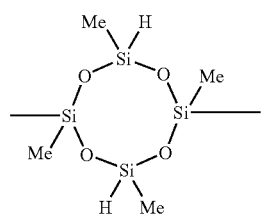

and the chain-like siloxane residues shown below:

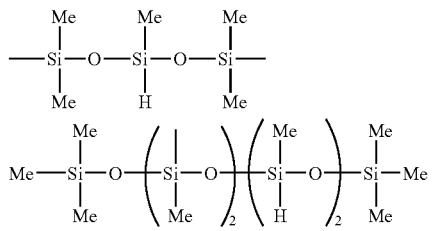

Specific examples of the group Y in the above formulas, that is, the bivalent residue of the polycyclic hydrocarbon of the above component (b), include the bivalent residues specifically represented by the structural formulas shown below:

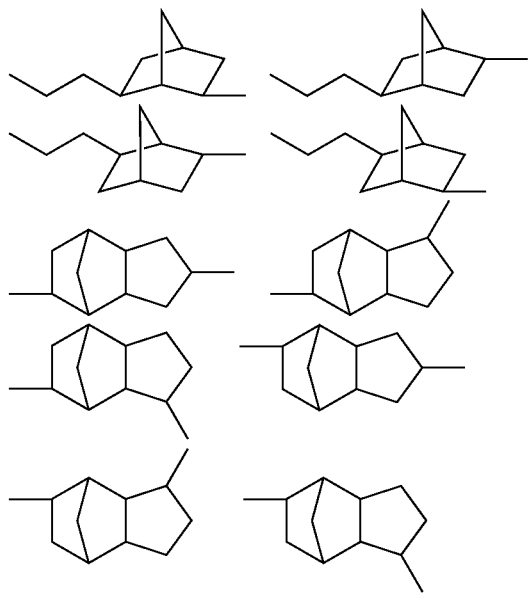

In the case of asymmetric bivalent residues represented by the above structural formulas, the left-right direction of the residue is not restricted to the orientation shown in the formula, and each of the structural formulas also includes the structure produced by a 180 degree rotation within the plane of the paper.

Specific examples of the group Y' in the above formulas, that is, the monovalent residue of the polycyclic hydrocarbon of the above component (b), include the residues represented by the structural formulas shown below:

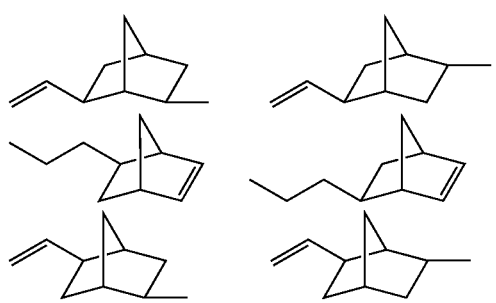

-continued

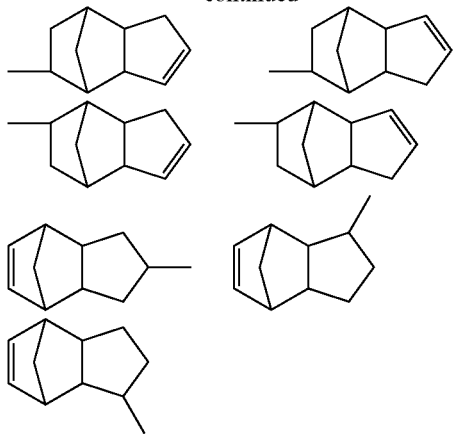

Next, specific examples of preferred forms of the aforementioned component (B3) are shown below, although the component (B3) is in no way restricted by these examples.

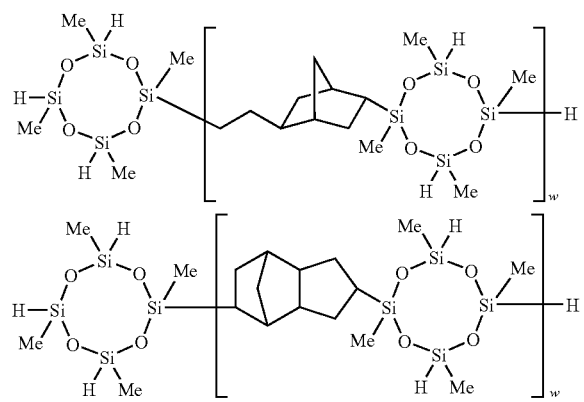

(In the formulas above, w is as defined above for the formula (10))

This component (B3), that is to say, the reaction product of (a) a siloxane-based compound containing at least three silicon atom-bonded hydrogen atoms within each molecule, and (b) a polycyclic hydrocarbon containing two addition reactive carbon-carbon double bonds within each molecule, which is a siloxane-polycyclic hydrocarbon-based compound containing at least two silicon atom-bonded hydrogen atoms within each molecule, is prepared, for example, by an addition reaction between cyclic 1,3,5,7-tetramethylcyclotetrasiloxane as the component (a), and 5-vinylbicyclo[2.2.1]hept-2-ene, represented by the structural formula (12) shown below:

(12)

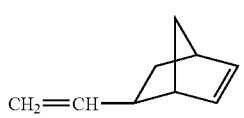

6-vinylbicyclo[2.2.1]hept-2-ene, represented by the structural formula (13) shown below:

(13)

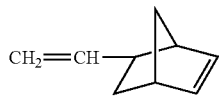

or a combination of the above two compounds (hereafter, these cases are not differentiated, and are referred to simply as "vinylnorbornene"), or a dicyclopentadiene represented by the structural formula (14) shown below:

(14)

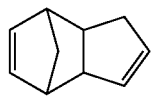

as the composition (b), in the presence of a hydrosilylation reaction catalyst (C) such as platinum described below.

The substitution position of the vinyl group of the above vinylnorbornenes may result in either the endo-form or the exo-form, or may also yield a combination of both isomers.

At the time of the above addition reaction, the quantities used of the component (a) and the component (b) are adjusted so that the quantity used of the component (a) such as 1,3,5,7-tetramethylcyclotetrasiloxane, relative to each 1 mol of the component (b) such as dicyclopentadiene, is within a range from 0.5 to 2 mols, and preferably from 1 to 1.5 mols, and most preferably from 1.1 to 1.3 mols, thereby enabling a siloxane-polycyclic hydrocarbon-based compound that contains at least two SiH groups within each molecule to be prepared as the component (B3).

The siloxane-polycyclic hydrocarbon-based compound of the component (B3) may use either a single material, or a combination of two or more different materials.

As is described below, this silicone resin composition may also include components containing silicon atom-bonded alkenyl groups other than the component (A3), and/or components containing silicon atom-bonded hydrogen atoms other than the component (B3). Accordingly, the quantity of silicon atom-bonded hydrogen atoms in this silicone resin composition relative to each 1 mol of silicon atom-bonded alkenyl groups in this silicone resin composition is typically within a range from 0.3 to 3.0 mols, and preferably from 0.8 to 2.0 mols. Moreover, the proportion of the total number of silicon atom-bonded alkenyl groups in this silicone resin composition accounted for by the silicon atom-bonded alkenyl groups in the component (A3) is typically within a range from 20 to 100 mol %, and is preferably from 40 to 100 mol %. With such values, a cured silicone resin layer with excellent physical properties, such as mechanical strength, can be obtained.

Furthermore, as mentioned above, from the point of improving the adhesion between the cured silicone rubber layer and the cured silicon resin layer, it is preferable that the quantity of silicon atom-bonded hydrogen atoms within this silicone resin composition, relative to each 1 mol of silicon atom-bonded alkenyl groups in this silicon resin composition, exceeds 0.9 mol, and is even more preferably greater than 0.9 mols but no more than 3.0 mols, and most preferably greater than 0.9 mols but no more than 2.0 mols.

(C) Hydrosilylation Reaction Catalyst

The hydrosilylation reaction catalyst that represents the component (C) is as described above, and the same compounds can be used as suitable examples.

There are no particular restrictions on the blend quantity of the component (C), which need only be an effective catalytic quantity, although in this silicone resin composition, a typical quantity, calculated as the mass of the platinum-group metal element, is normally within a range from 1 to 500 ppm, and preferably from 2 to 100 ppm. By using a blend quantity that falls within this particular range, the time required for the curing reaction of the silicone resin composition is appropriate, and problems such as coloring of the cured product do not occur.

The hydrosilylation reaction catalyst of this component may use either a single material, or a combination of two or more different materials.

Other Components

The silicone resin composition may also contain, in addition to the components (A3), (B3) and (C), adhesion imparting agents, reaction retarders, and inorganic fillers and the like, provided the addition of these other components does not impair the effects of the present invention. Specific examples of these other components include the materials listed above in the paragraph concerning other components of the silicone rubber composition.

In addition, an antioxidant can also be added if required. Any conventionally known antioxidant can be used. Examples of suitable materials include 2,6-di-t-butyl-4-methylphenol, 2,5-di-t-amylhydroquinone, 2,5-di-t-butylhydroquinone, 4,4'-butylidenebis(3-methyl-6-t-butylphenol), 2,2'-methylenebis(4-methyl-6-t-butylphenol), and 2,2'-methylenebis(4-ethyl-6-t-butylphenol).

In those cases where an antioxidant is used, there are no particular restrictions on the blend quantity used provided it is an effective quantity as an antioxidant, although a typical quantity, calculated relative to the combined mass of the component (A3) and the component (B3), is normally within a range from 10 to 10,000 ppm, and preferably from 100 to 1,000 ppm. By ensuring the blend quantity falls within this particular range, the antioxidation action can be manifested satisfactorily, and a cured silicone resin layer with excellent optical characteristics, in which coloring, turbidity, or oxidative degradation do not occur, can be obtained.

In addition, light stabilizers can also be added for imparting resistance to light deterioration caused by light energy from sunlight or fluorescent lights or the like. Hindered amine based stabilizers, which capture the radicals generated upon oxidation and deterioration of the cured product caused by light exposure, are ideal as these light stabilizers, and by using such light stabilizers in combination with the antioxidants described above, the oxidation prevention effect can be further improved. Specific examples of these light stabilizers include bis(2,2,6,6-tetramethyl-4-piperidyl) sebacate and 4-benzoyl-2,2,6,6-tetramethylpiperidine.

Furthermore, in order to regulate the viscosity of the silicone resin composition, or regulate the hardness of the cured silicone resin layer, straight-chain diorganopolysiloxanes or network-type organopolysiloxanes containing either silicon atom-bonded alkenyl groups or silicon atom-bonded hydrogen atoms, and/or unreactive straight-chain or cyclic diorganopolysiloxanes or silphenylene-based compounds may also be added.

These other components may use either a single material, or a combination of two or more different materials.

A liquid curable type silicone resin composition 2 can be prepared by stirring and mixing together the component (A3), the component (B3) and the component (C), together with any other components, using conventional methods. By curing this composition, preferably at 60 to 180° C. over a period of 5 to 180 hours, a cured silicone resin layer used in a silicone-sealed LED of the present invention can be produced.

<Production Process for Silicone-Sealed LED>

The silicone-sealed LED of the present invention can be produced by the process comprising the steps of:

(1) coating a LED chip with a cured silicone rubber layer, and (2) coating and sealing a periphery of the cured silicone rubber layer with a cured silicone resin layer. The cured silicone rubber layer is preferably a cured product of a liquid curable silicone rubber composition, and the cured silicone resin layer is preferably a cured product of a liquid curable silicone resin composition. The step (1) comprises the steps of:

applying the liquid curable silicone rubber composition to the LED chip and curing the liquid curable silicone rubber composition to form the cured silicone rubber layer on the LED chip. The step (2) comprises the steps of:

applying the liquid curable silicone resin composition to the periphery of the cured silicone rubber layer and curing the liquid curable silicone resin composition to form the cured silicone resin layer on the periphery of the cured silicone rubber layer. The liquid curable silicone rubber composition is as described above, and the same compositions can be used as suitable examples. The liquid curable silicone resin composition is also as described above, and the same compositions can be used as suitable examples.

<Sealing Process for LED>

A LED can be sealed by the process comprising the steps of:

(3) coating a LED chip with a cured silicone rubber layer, and (4) coating and sealing a periphery of the cured silicone rubber layer with a cured silicone resin layer. The cured silicone rubber layer is preferably a cured product of a liquid curable silicone rubber composition, and the cured silicone resin layer is preferably a cured product of a liquid curable silicone resin composition. The step (3) comprises the steps of:

applying the liquid curable silicone rubber composition to the LED chip and curing the liquid curable silicone rubber composition to form the cured silicone rubber layer on the LED chip. The step (4) comprises the steps of:

applying the liquid curable silicone resin composition to the periphery of the cured silicone rubber layer and curing the liquid curable silicone resin composition to form the cured silicone resin layer on the periphery of the cured silicone rubber layer. The liquid curable silicone rubber composition is as described above, and the same compositions can be used as suitable examples. The liquid curable silicone resin composition is also as described above, and the same compositions can be used as suitable examples.

EXAMPLES

As follows is a more detailed description of the present invention using a series of examples, although the present invention is in no way limited by these examples.

Rubber Synthesis Example 1

A silicone rubber composition 1 was prepared by uniformly mixing 100 parts by mass of a dimethylpolysiloxane with both molecular chain terminals blocked with vinyl groups and with a viscosity of 600 mPa·s at 23° C., a quantity of a platinum catalyst with divinyltetramethyldisiloxane ligands equivalent to a mass of platinum of 10 ppm, 0.1 parts by mass of tetramethyltetravinyltetrasiloxane, and 0.6 parts by mass of a compound represented by a formula: $Me_3SiO(SiMe(H)O)_{11}SiMe_3$. In this silicone rubber composition 1, the quantity of silicon atom-bonded hydrogen atoms relative to each 1 mol of silicon atom-bonded vinyl groups, is 0.54 mols. This silicone rubber composition 1 was cured by heating for one hour at 120° C., thereby yielding a cured silicone rubber 1. The penetrability of the cured silicone rubber 1 was 15, and the hardness, measured using a JIS Type A hardness meter, was 0.

Rubber Synthesis Example 2

With the exceptions of altering the blend quantity of the compound represented by the formula: $Me_3SiO(SiMe(H)O)_{11}SiMe_3$ from the 0.6 parts by mass used in the silicone rubber composition 1 to 0.3 parts by mass, and also adding 2 parts by mass of a compound represented by a formula: $Me_3SiO(SiMeHO)_2(SiMe_2O)_7(SiMe(CH_2CH_2Si(OMe)_3)O)SiMe_3$, a silicone rubber composition 2 was prepared in the same manner as the rubber synthesis example 1, thereby yielding a cured silicone rubber composition 2. In the silicone rubber composition 2, the quantity of silicon atom-bonded hydrogen atoms relative to each 1 mol of silicon atom-bonded vinyl groups, is 0.64 mols. The penetrability of the cured silicone rubber 2 was 23, and the hardness, measured using a JIS Type A hardness meter, was 0.

Rubber Synthesis Example 3

A silicone rubber composition 3 was prepared by uniformly mixing 100 parts by mass of a methylphenylpolysiloxane with both molecular chain terminals blocked with vinyl groups, with a viscosity of 4,000 mPa·s at 23° C., and containing 30 mol % of phenyl groups at non-terminal molecular chain positions, a quantity of a platinum catalyst with divinyltetramethyldisiloxane ligands equivalent to a mass of platinum of 10 ppm, 0.1 parts by mass of tetramethyltetravinyltetrasiloxane, 0.5 parts by mass of a compound represented by a formula: $Me_3SiO(SiMe(H)O)_{11}SiMe_3$, and 2 parts by mass of a compound represented by a formula: $Me_3SiO(SiMeHO)_2(SiMe_2O)_7(SiMe(CH_2CH_2Si(OMe)_3)O)SiMe_3$. In the silicone rubber composition 3, the quantity of silicon atom-bonded hydrogen atoms relative to each 1 mol of silicon atom-bonded vinyl groups, is 0.63 mols. This silicone rubber composition 3 was cured by heating for one hour at 120° C., thereby yielding a cured silicone rubber 3. The penetrability of the cured silicone rubber 3 was 17, and the hardness, measured using a JIS Type A hardness meter, was 0.

Resin Synthesis Example 1

116 parts by mass of phenyltrichlorosilane, 28.2 parts by mass of vinylmethyldichlorosilane, and 32.3 parts by mass of dimethyldichlorosilane were placed in a dropping funnel, and added dropwise to a flask charged with 324 parts by mass of toluene and 304 parts by mass of water, and cohydrolysis and a subsequent condensation polymerization reaction yielded a siloxane compound represented by a formula: $(CH_3)_{0.7}(C_6H_5)_{0.55}(CH_2=CH)_{0.20}SiO_{1.28}$, which after 30 minutes at 150° C. existed as a toluene solution with a non-volatile fraction of 50% by mass. To 100 parts by mass of the siloxane compound within this solution were added 25 parts by mass of a cross-linking agent represented by an average formula shown below, which has a viscosity of 2 mPa·s at 23° C., contains 15 mols of phenyl groups, and generates 200 ml of hydrogen gas,

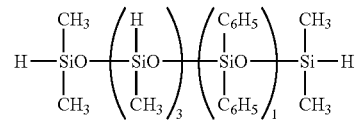

and 10 parts by mass of an adhesive imparting agent represented by a structural formula shown below,

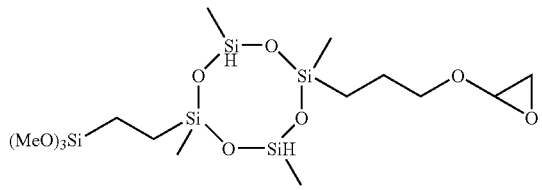

and following stirring for one hour at 80° C., the mixture was heated to 120° C. and the toluene was removed under reduced pressure, yielding a uniform, colorless and transparent liquid. To this liquid was added a quantity of a platinum catalyst with divinyltetramethyldisiloxane ligands equivalent to a mass of platinum of 10 ppm, and after uniform mixing, the composition was heated and cured at 100° C. for one hour, and then at 150° C. for a further one hour, thereby yielding a colorless and transparent cured silicone resin composition 1. The hardness of this cured silicone resin composition 1, measured using a Shore D hardness meter, was 68. In this silicone resin composition 1, the quantity of silicon atom-bonded hydrogen atoms relative to each 1 mol of silicon atom-bonded vinyl groups, is 1.05.

Resin Synthesis Example 2

150 parts by mass of a silicone resin composition comprising $Me_3SiO_{1/2}$ units, $ViMe_2SiO_{1/2}$ units, and $SiO_{4/2}$ units, in which the ratio of the combined quantity of the $Me_3SiO_{1/2}$ units and the $ViMe_2SiO_{1/2}$ units relative to the $SiO_{4/2}$ units is a molar ratio of 0.95, was dissolved in toluene, yielding a 50% by mass toluene solution. After stripping of the toluene solution for one hour under conditions of 120° C. and 15 mmHg, the quantity of vinyl groups within the silicone resin composition was, 0.08 mols per 100 g of the remaining solid fraction. To the aforementioned toluene solution were added 25 parts by mass of a dimethylsilicone polymer with both molecular chain terminals blocked with vinyl groups and with a viscosity of 60 mPa·s at 23° C., 3 parts by mass of tetramethyltetravinyltetrasiloxane, 10 parts by mass of a compound represented by a formula: $Me_3SiO(SiMeHO)_{11}SiMe_3$, and 5 parts by mass of an adhesive imparting agent represented by a structural formula shown below:

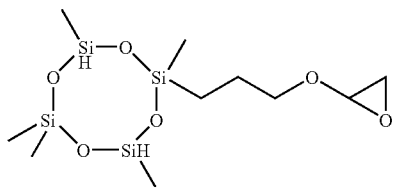

following stirring to generate a uniform solution, stripping was conducted under conditions of 120° C. and 15 mmHg, yielding a transparent liquid. To this liquid was added a quantity of a platinum catalyst with divinyltetramethyldisiloxane ligands equivalent to a mass of platinum of 10 ppm, and after uniform mixing, the composition was heated and cured at 100° C. for one hour, and then at 150° C. for a further one hour, thereby yielding a colorless and transparent cured silicone resin composition 2. The hardness of this cured silicone resin composition 2, measured using a Shore D hardness meter, was 48. In this silicone resin composition 2, the quantity of silicon atom-bonded hydrogen atoms relative to the silicon atom-bonded vinyl groups, is 1.43.

Resin Synthesis Example 3

A 500 mL four-neck flask fitted with a stirrer, a condenser tube, a dropping funnel, and a thermometer was charged with 80 g of toluene and 115.2 g (0.48 mols) of 1,3,5,7-tetramethylcyclotetrasiloxane, and the flask was then heated to 117° C. using an oil bath. 0.05 g of carbon powder supporting 5% by mass of a platinum metal was then added to the solution, and with the mixture undergoing constant stirring, 48 g (0.4 mols) of vinylnorbornene (product name: V0062, manufactured by Tokyo Kasei Kogyo Co., Ltd., an approximately equimolar isomeric mixture of 5-vinylbicyclo[2.2.1]hept-2-ene and 6-vinylbicyclo[2.2.1]hept-2-ene) was added dropwise over a period of 16 minutes. Following completion of the dropwise addition, the reaction mixture was stirred for a further 16 hours while heating at 125° C., and was then cooled to room temperature (25° C.). Subsequently, the platinum metal-supporting carbon was removed by filtration, and the toluene was removed under reduced pressure, yielding a colorless and transparent oily reaction product (viscosity at 23° C.: 2,500 mPa·s). 68 parts by mass of this reaction product (A3), 32 parts by mass of (ViMeSiO)$_4$ (B3), a platinum-vinylsiloxane complex in sufficient quantity to provide 20 ppm of platinum relative to the combined mass of the component (A3) and the component (B3), and 0.03 parts by mass of 1-ethynylcyclohexanol were mixed together uniformly, yielding a silicone resin composition 3. This silicone resin composition 3 was poured into a mold made from glass plates such that it becomes to generate a thickness of 4 mm, and was then heated at 150° C. for 2 hours, thus yielding a cured silicone resin 3. The hardness of this cured silicone resin composition 3, measured using a Shore D hardness meter, was 54. In this silicone resin composition 3, the quantity of silicon atom-bonded hydrogen atoms relative to the silicon atom-bonded vinyl groups, is 1.00.

EXAMPLES

Adhesion Testing

The adhesion of the cured silicone rubber layers and the cured silicone resin layers obtained in the above synthesis examples was tested in accordance with the following method.

Firstly, the prepared silicone rubber composition was poured into a glass Petri dish of diameter 25 mm, the glass Petri dish containing the silicone rubber composition was placed in a dryer, and the silicone rubber composition was cured at 120° C. over a period of one hour. Following removal of the Petri dish from the dryer and cooling to room temperature, the prepared silicone resin composition was added dropwise onto the obtained cured silicone rubber layer, and the silicone resin composition was cured under the curing conditions (temperature and time) described in the corresponding resin synthesis example or resin comparative synthesis example described above. Following removal of the obtained laminate of the cured silicone rubber layer and the cured silicone resin layer from the glass Petri dish, the adhesion between the cured silicone rubber layer and the cured silicone resin layer was tested by grasping the layer of the cured silicone resin by hand, and separating the two layers.

At the point of separation, if cohesive failure of the cured silicone rubber layer occurred, the adhesion was evaluated as favorable, indicated by an A. If the cured silicone rubber layer and the cured silicone resin layer were strongly adhered, but separation was achievable, the adhesion was evaluated as satisfactory, indicated by a B. If separation occurred easily between the cured silicone rubber layer and the silicone resin layer, the adhesion was evaluated as poor, indicated by a C. The obtained results are shown in Table 1.

TABLE 1

| Resin | Rubber | | |
| --- | --- | --- | --- |
| | 1 | 2 | 3 |
| 1 | A | A | A |
| 2 | A | A | A |
| 3 | A | A | A |

What is claimed is:

1. A process for producing a silicone-sealed LED, comprising:
    (1) applying a liquid curable silicone rubber composition to a LED chip and curing said liquid curable silicone rubber composition to form a cured silicone rubber layer with a hardness, as measured by a JIS Type A hardness meter, within a range of 0 to 50 on and in contact with said LED chip, and thereafter
    (2) applying a liquid curable silicone resin composition to a periphery of said cured silicone rubber layer and curing said liquid curable silicone resin composition to form a cured silicone resin layer with a hardness, as measured by a Shore D hardness meter, of at least 40 on the periphery of said cured silicone rubber layer,
    wherein the difference between the refractive index of said liquid curable silicone rubber composition and the refractive index of said liquid curable silicone resin composition is no greater than 0.05, and
    said liquid curable silicone resin composition comprises:
    (A3) a siloxane-based compound that comprises at least two silicon atom-bonded alkenyl groups within each molecule;
    (B3) a siloxane-polycyclic hydrocarbon-based compound, which is an addition reaction product of (a) a siloxane-based compound comprising at least three silicon atom-bonded hydrogen atoms within each molecule, and (b) a polycyclic hydrocarbon comprising two addition reactive carbon-carbon double bonds within each molecule, and comprises at least two silicon atom-bonded hydrogen atoms within each molecule; and (C) a hydrosilylation reaction catalyst.

2. The process according to claim 1, wherein said liquid curable silicone rubber composition and said liquid curable silicone resin composition are both addition curable compositions that are cured by a hydrosilylation reaction between silicon atom-bonded alkenyl groups and silicon atom-bonded hydrogen atoms.

3. The process according to claim 2, wherein within said liquid addition curing-type silicone rubber composition, a quantity of silicon atom-bonded hydrogen atoms relative to each 1 mol of silicon atom-bonded alkenyl groups is no greater than 0.9 mols, and within said liquid addition curing-type silicone resin composition, a quantity of silicon atom-bonded hydrogen atoms relative to each 1 mol of silicon atom-bonded alkenyl groups exceeds 0.9 mols.

4. The process according to claim 1, wherein said liquid curable silicone rubber composition comprises:
(A1) an organopolysiloxane comprising at least one silicon atom-bonded alkenyl group within each molecule, represented by formula (1):

$$R_3SiO(SiR_2O)_a SiR_3 \qquad (1)$$

wherein, each R represents, independently, an unsubstituted or substituted monovalent hydrocarbon group, and a represents a positive number at which the viscosity of said organopolysiloxane at 23° C. is no greater than 100,000 mPa·s;
(B 1) an organohydrogenpolysiloxane comprising at least two silicon atom-bonded hydrogen atoms within each molecule, represented by formula (2):

$$R^1_3SiO(SiR^2_2O)_b(SiR^2(H)O)_c SiR^1_3 \qquad (2)$$

wherein,
each $R^1$ represents, independently, a hydrogen atom or an unsubstituted or substituted monovalent hydrocarbon group that contains no aliphatic unsaturated bonds,
each $R^2$ represents, independently, an unsubstituted or substituted monovalent hydrocarbon group that contains no aliphatic unsaturated bonds, and
b and c represent positive numbers at which the viscosity of said organohydrogenpolysiloxane at 23° C. is no greater than 10,000 mPa·s, in a quantity that ensures that a quantity of silicon atom-bonded hydrogen atoms within said silicone rubber relative to each 1 mol of silicon atom-bonded alkenyl groups within said silicone rubber is no greater than 0.9 mols; and
(C) an effective quantity of a hydrosilylation reaction catalyst.

5. The process according to claim 4, wherein (A1) is at least one member selected from the group consisting of $ViMe_2SiO(SiMe_2O)_g SiMe_2Vi$, $ViMe_2SiO(SiMe_2O)_g(SiMePhO)_h SiMe_2Vi$, $ViMe_2SiO(SiMe_2O)_g(SiPh_2O)_h SiMe_2Vi$, $ViMe_2SiO(SiMe(C_3H_4F_3)O)_g SiMe_2Vi$, $Me_3SiO(SiViMeO)_g(SiMe_2O)_h SiMe_3$, $ViMe_2SiO(SiViMeO)_g(SiMe_2O)_h SiMe_2Vi$, $Vi_3SiO(SiMe_2O)_g SiMeVi_3$, and $ViMe_2SiO(SiMe_2O)_g SiMe_3$,
wherein, Vi represents a vinyl group, Me represents a methyl group, Ph represents a phenyl group, g and h each independently represent positive integers, and g+h falls within a range that satisfies the viscosity.

6. The process according to claim 4, wherein (B1) is at least one selected member from the group consisting of $Me_3SiO$  $(SiMe(H)O)_i SiMe_3$, $Me_3SiO(SiMe(H)O)_i(SiMe_2O)_j SiMe_3$, $Me_3SiO(SiMe(H)O)_i(SiPh_2O)_k(SiMe_2O)_j SiMe_3$, $(H)Me_2SiO(SiMe_2O)_j SiMe_2(H)$, $(H)Me_2SiO(SiMe(H)O)_i (SiMe_2O)_j SiMe_2(H)$, tetramethyltetrahydrocyclosiloxane, and $PhSi(OSiMe_2H)_3$,
wherein, i, j and k each independently represent positive integers, and i, i+j, and i+j+k each fall within a range that satisfies the viscosity.

7. The process according to claim 1, wherein (A3) is at least one member selected from the group consisting of $(ViMeSiO)_3$, $(ViMeSiO)_4$, $(ViMeSiO)_3(Me2SiO)$, $(ViMeSiO)_4(Me2SiO)$, $Me_3SiO—(ViMeSiO)_5(Me2SiO)_5—SiMe_3$, $ViMe_2SiO—(Me_2SiO)_5—SiMe_2Vi$, $ViMe_2SiO—(Ph_2SiO)_5(Me_2SiO)_5—SiMe_2Vi$, and $ViMe_2SiO—(ViMeSiO)_5 (Me_2SiO)_5—SiMe_2Vi$, wherein
Vi is a vinyl group;
Me is a methyl group; and
Ph is a phenyl group.

8. The process according to claim 1, wherein (B3) is at least one member selected from the group consisting of

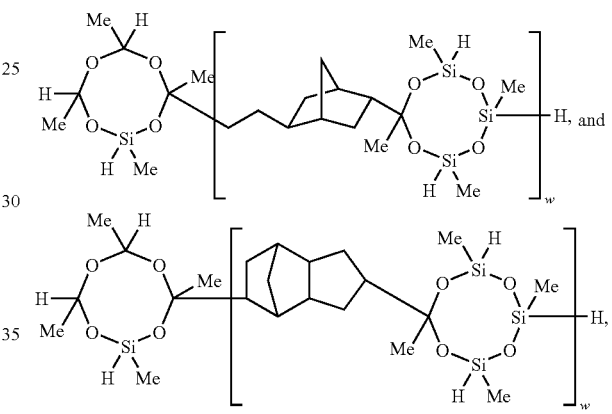

wherein W represents an integer from 1 to 1,000.

9. The process according to claim 1, wherein said hardness of said cured silicone rubber layer, as measured by a JIS Type A hardness meter, ranges from 0 to 20 and said hardness of said cured silicon resin layer, as measured by a Shore D hardness meter, ranges from 60 to 90.

10. The process according to claim 1, wherein said difference between the refractive index of said liquid curable silicone rubber composition and the refractive index of said liquid curable silicone resin composition is no greater than 0.03.

11. The process according to claim 1, wherein said difference between the refractive index of said liquid curable silicone rubber composition and the refractive index of said liquid curable silicone resin composition is no greater than 0.025.

12. The process according to claim 1, wherein the hardness of said cured silicone rubber layer, as measured by a JIS Type A hardness meter, is within a range of 0 to 20.

* * * * *